United States Patent [19]

Sakaida

[11] 4,153,879

[45] May 8, 1979

[54] SHOCK MUTING CIRCUIT FOR USE IN AN AM RECEIVER

[75] Inventor: Kaku Sakaida, Tokyo, Japan

[73] Assignee: Trio Kabushiki Kaisha, Tokyo, Japan

[21] Appl. No.: 822,944

[22] Filed: Aug. 8, 1977

[51] Int. Cl.² ............................................. H04B 1/10
[52] U.S. Cl. ................................... 325/478; 325/480; 325/493
[58] Field of Search ............... 325/348, 377, 402, 456, 325/473, 478, 488, 492, 493; 358/167, 190, 194; 179/1 P; 330/51, 149

[56] References Cited

U.S. PATENT DOCUMENTS

| 2,269,300 | 1/1942 | Andrews | 325/493 |
| 3,916,321 | 10/1975 | Morse | 325/478 |
| 4,006,307 | 2/1977 | Danielsen et al. | 179/1 P |

Primary Examiner—Robert L. Griffin
Assistant Examiner—Jin F. Ng
Attorney, Agent, or Firm—Gerald J. Ferguson, Jr.; Joseph J. Baker

[57] ABSTRACT

A switch-off shock muting circuit for use in an AM receiver comprising a muting element disposed in a signal transmission path extending from the antenna through the demodulation and low frequency amplifying sections to the speaker of the receiver, a power switch and control switching means interlocked with the power switch, the control switching means being operated at an earlier time than the turning off of the power switch to thereby control the muting element, whereby spark noise caused by the power switch is prevented by controlling the muting element from the control switching means to thereby interrupt the signal transmission line earlier than the turning off of the power switch.

2 Claims, 1 Drawing Figure

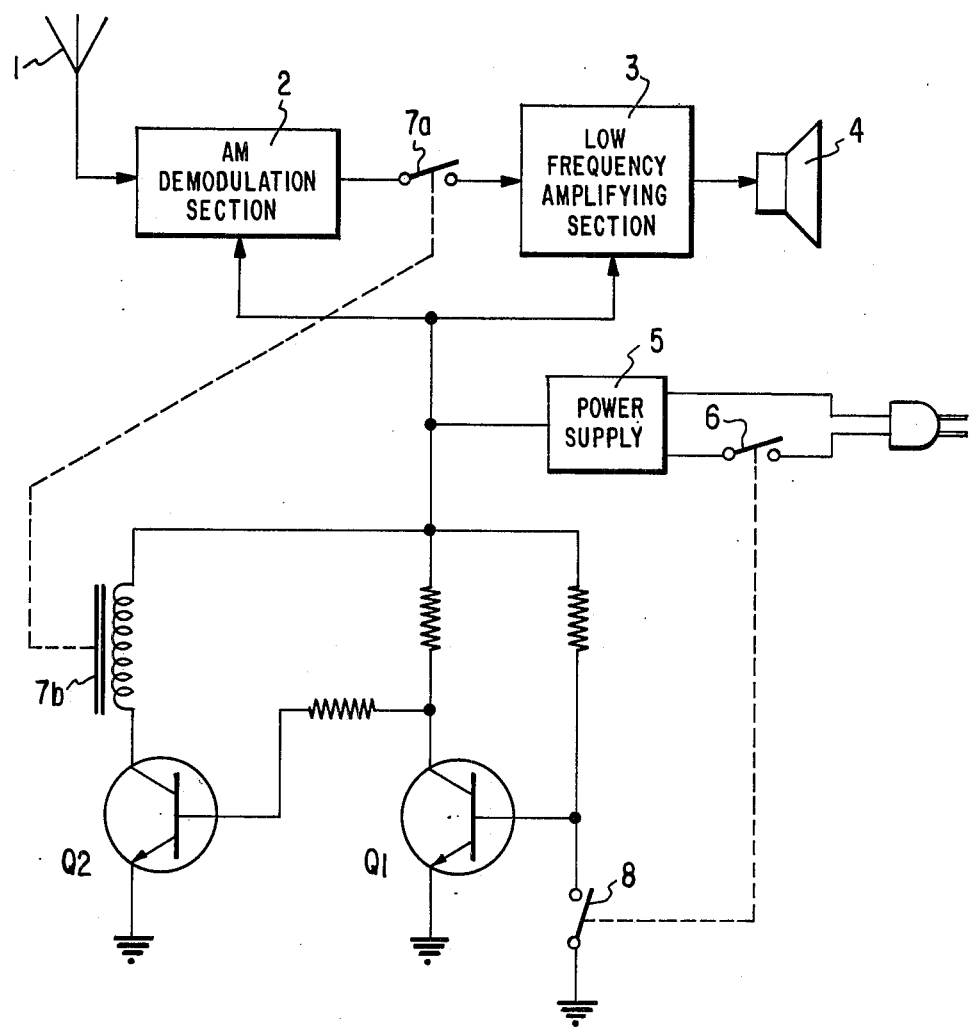

SHOCK MUTING CIRCUIT FOR USE IN AN AM RECEIVER

BACKGROUND AND SUMMARY OF THE INVENTION

When the power switch of an AM receiver is turned off, sparks sometimes occur between the contacts of the power switch, enter the antenna and are released as shock noise from the speaker.

The object of this invention is to provide a shock muting circuit in an AM receiver which eliminates the shock noise caused by sparks from the power switch.

BRIEF DESCRIPTION OF THE DRAWING

The sole figure of the drawing is a circuit diagram of a working embodiment of the invention.

DETAILED DESCRIPTION OF EMBODIMENT

In the diagram, the AM receiver consists of an antenna 1, a demodulation section 2 which includes a high frequency amplifying circuit, a frequency conversion circuit, an intermediate frequency amplifying circuit, and a detecting circuit, a low frequency amplifying section 3, a speaker 4, a power pack 5 which supplies power voltage to AM demodulation section 2 and low frequency amplifying section 3, and a power switch 6. 7a is a relay switch inserted between AM demodulation section 2 and low frequency amplifying section 3. The relay switch 7a is switch-controlled by a relay coil 7b controlled by the on-off operation of transistors Q1 and Q2. 8 is a switch that is interlocked with power switch 6 and whose switch timing is set earlier than that of power switch 6. It is connected between the base of transistor Q1 and earth.

In operation, when power switch 6 is on, switch 8 is also on. Thus, the base of transistor Q1 is grounded and transistor Q1 does not conduct whereby transistor Q2 does conduct supplying current to relay coil 7b and relay switch 7a is turned on. Therefore, the signal from AM demodulation section 2 is supplied in this case to low frequency amplifying section 3 through relay switch 7a.

When power switch 6 is turned off, switch 8 turns off sooner than power switch 6 whereby transistor Q1 conducts and transistor Q2 does not conduct. Appropriate delay means or circuitry (not shown) for delaying the opening of switch 6 with respect to the opening of switch 8 is employed. Thus, when Q2 stops conducting, current is not supplied to relay coil 7b and relay switch 7a is turned off. Consequently, the signal from AM demodulation section 2 is interrupted by relay switch 7a and not supplied to low frequency amplifying section 3. Therefore, when power switch 6 is turned off after the off operation of switch 8, if sparks should occur between the contacts of power switch 6 and enter antenna 1, the shock noise caused by these sparks will not be radiated from speaker 4.

As described above, according to this invention, the shock noise attributable to sparks caused by the power switch being turned off can be prevented by a muting element inserted into the signal transmission line of the AM receiver, and the on-off control of the muting element is interlocked with the power switch so as to be controlled by a switch operated at an earlier time than the turning off of the power switch.

The muting element is not limited to the relay in the abovementioned working example, bit transistors, or field-effect transistors may also be used.

What is claimed is:

1. In a radio receiver having (1) a signal transmission path extending from the antenna through the demodulation and low frequency amplifying sections to the speaker of the receiver and (2) a power switch which tends to spark when opened and radiate the sparks to said antenna, after which the sparks are transmitted over said transmission path to said speaker and emitted as shock noise, the improvement of a muting circuit for said shock noise, said muting circuit comprising signal interrupting means for preventing a signal from said antenna from reaching said speaker in response to a control signal being applied to said signal interrupting means, control signal generating means responsive to the initiation of the opening of said power switch for generating said control signal prior to the actual opening of said power switch so that said signal interruption means is actuated prior to the opening of said power switch to thereby prevent said shock noise from being emitted from said speaker.

2. A switch-off shock muting circuit for use in an AM receiver comprising a muting element disposed in a signal transmission path extending from the antenna through the demodulation and low frequency amplifying sections to the speaker of the receiver, a power switch and control switching means interlocked with the power switch, said control switching means being operated at an earlier time than the turning off of said power switch to thereby control said muting element, whereby spark noise caused by the power switch is prevented by controlling said muting element from said control switching means to thereby interrupt the signal transmission path earlier than the turning off of the power switch.

* * * * *

UNITED STATES PATENT AND TRADEMARK OFFICE
CERTIFICATE OF CORRECTION

PATENT NO. : 4,153,879
DATED : May 8, 1979
INVENTOR(S) : Kaku Sakaida

It is certified that error appears in the above-identified patent and that said Letters Patent are hereby corrected as shown below:

On the title page the priority data should be inserted as follows:

--August 26, 1976          Japan               51-114502 --

Signed and Sealed this

Thirteenth Day of November 1979

[SEAL]

Attest:

RUTH C. MASON
Attesting Officer

LUTRELLE F. PARKER
Acting Commissioner of Patents and Trademarks